US006777670B1

(12) United States Patent
Farnsworth

(10) Patent No.: US 6,777,670 B1
(45) Date of Patent: Aug. 17, 2004

(54) MASS ANALYZER CAPABLE OF PARALLEL PROCESSING ONE OR MORE ANALYTES

(75) Inventor: Vincent R. Farnsworth, Agoura, CA (US)

(73) Assignee: Beckman Coulter, Inc., Fullerton, CA (US)

( * ) Notice: Subject to any disclaimer, the term of this patent is extended or adjusted under 35 U.S.C. 154(b) by 0 days.

(21) Appl. No.: 10/249,320

(22) Filed: Mar. 31, 2003

(51) Int. Cl.[7] .................................................. H01J 37/05

(52) U.S. Cl. ........................ 250/285; 250/281; 250/283; 250/293; 250/295; 250/397

(58) Field of Search ................................ 250/285, 281, 250/283, 293, 295, 397

(56) References Cited

U.S. PATENT DOCUMENTS

| | | | | |
|---|---|---|---|---|
| 3,796,872 A | * | 3/1974 | Merren | 250/283 |
| 3,886,357 A | * | 5/1975 | Naito | 250/285 |
| 4,126,804 A | | 11/1978 | Asam et al. | |
| 4,208,582 A | | 6/1980 | Arnush et al. | |
| 5,514,868 A | | 5/1996 | Dixon | |
| 6,153,880 A | | 11/2000 | Russ, IV et al. | |
| 6,410,914 B1 | | 6/2002 | Park et al. | |
| 6,521,887 B1 | | 2/2003 | Funsten et al. | |
| 6,545,268 B1 | | 4/2003 | Verentchikov et al. | |

* cited by examiner

*Primary Examiner*—Nikita Wells
(74) *Attorney, Agent, or Firm*—William H. May; D. David Hill; Robert B. Polit

(57) ABSTRACT

An improved mass analyzer capable of parallel processing one or more analytes is set forth. The mass analyzer comprises a mass filter unit having a plurality of ion selection chambers disposed in parallel with one another. Each of the plurality of ion selection chambers respectively includes an ion inlet lying in an inlet plane and an ion outlet lying in an outlet plane. The mass analyzer further includes a plurality of electrodes disposed in the ion selection chambers and at least one RF signal generator connected to the plurality of electrodes to produce a non-rotating, oscillating electric field in each ion selection chambers. A plurality of ion injectors are each coupled to inject an ion beam into the ion inlet of a respective ion selection chambers. The ions meeting predetermined m/Q requirements pass through the ion selection chambers to contact corresponding detection surfaces of an ion detector array. The mass filter array may also be constructed so that at least one pair of ion selection chambers share at least one common field generating electrode.

36 Claims, 8 Drawing Sheets

MASS ANALYZER CAPABLE OF PARALLEL PROCESSING ONE OR MORE ANALYTES

BACKGROUND OF INVENTION

The present invention is generally directed to mass analyzers. More particularly, the present invention is directed to a mass analyzer having an improved mass filter and/or ion detection arrangement that facilitates parallel processing of one or more analytes.

The characteristics of mass spectrometry have raised it to an outstanding position among the various analysis methods. It has excellent sensitivity and detection limits and may be used in a wide variety of applications, e.g. atomic physics, reaction physics, reaction kinetics, geochronology, biomedicine, ion-molecule reactions, and determination of thermodynamic parameters ($\Delta G^{\circ}_{f}$, $K_a$, etc.). Mass spectrometry technology has thus begun to progress very rapidly as its uses have become more widely recognized. This has led to the development of entirely new instruments and applications.

Development trends have gone in the direction of increasingly complex mass analyzer designs requiring highly specialized components and tight manufacturing tolerances. Longer analysis times are often associated with this increased complexity. This, in turn, requires system designers to make significant design trade-offs between the accuracy of the mass measurements and the time required to obtain those measurements. However, such trade-offs have become increasingly intolerable in the competitive field of drug discovery and analysis. There, mass analyzers must be both highly accurate and provide for a high throughput of analytes.

One attempt to improve on existing mass analyzers is shown in U.S. Pat. No. 5,726,448, issued Mar. 10, 1998, to Smith et al. The '448 patent purportedly describes a mass analyzer having a mass filter chamber that employs a rotating RF electric field for ion sample separation. Rotation of the electric field is achieved through the use of at least four electrodes that operate in opposed parallel pairs. A first RF signal is applied to the first pair of parallel electrodes while a second RF signal is applied to the second pair of parallel electrodes. The first and second RF signals differ in phase by $\pi/2$ and thereby generate the desired field rotation.

Several mass analyzer embodiments are illustrated in the figures of the '448 patent. In one embodiment, shown in FIGS. 3–9 of the patent, a mass filter chamber is used in which both the first and second electrode pairs are aligned along the same length of the chamber. In a further embodiment, shown in FIG. 10 of the patent, the second electrode pair is displaced from the first electrode pair along the length of the chamber. In each of the foregoing illustrations, the electric field generated at the second electrode pair is out of phase by $\pi/2$ from the electric field generated at the first electrode pair so that the ions are acted upon by at least two distinct electric fields. Thus, at least two orthogonal electric fields are mandated for operation of each of the embodiments specified in the illustrations.

The ions reaching the outlet end of the mass filter chamber form a circle for each set of ions having a given mass-to-charge ratio, m/Q. It is this circular pattern that is analyzed to determine the characteristics of the sample. Accordingly, the ion detector described in the '448 patent is configured as a two-dimensional device array that must necessarily (and without option) provide and process two coordinate values for each impinging ion. As shown in FIG. 6 of the '448 patent, the ion detector is disposed immediately adjacent and coextensive with the ion outlet end of the mass filter chamber to ensure detection of substantially all of the ions exiting the mass filter chamber without further regard to their m/Q values.

The present inventors have recognized that existing mass analysis apparatus may be improved in a variety of manners. For example, decreased complexity of one or more components may be achieved by, for example. employing a single, non-rotating RF electric field rather than the rotating field noted above in the '448 patent. Alternatively, in lieu of, or in addition to the foregoing, improvements can be realized by developing unique ion detection arrangements that take advantage of predetermined ion exit angles from the mass filter for ions having selected m/Q values. Still further, such components can be optimally arranged to concurrently process one or more analytes in parallel with one another to thereby improve the throughput of the analyzer. Such improvements can be achieved while still maintaining or exceeding manufacturing, mass resolution, and/or mass sensitivity goals.

SUMMARY OF INVENTION

An improved mass analyzer capable of parallel processing one or more analytes is set forth. The mass analyzer comprises a mass filter unit having a plurality of ion selection chambers disposed in parallel with one another. Each of the plurality of ion selection chambers respectively includes an ion inlet lying in an inlet plane and an ion outlet lying in an outlet plane. The mass analyzer further includes a plurality of electrodes disposed in the ion selection chambers and at least one RF signal generator connected to the plurality of electrodes to produce a non-rotating, oscillating electric field in each ion selection chambers. A plurality of ion injectors are each coupled to inject an ion beam into the ion inlet of a respective ion selection chambers. The ions meeting predetermined m/Q requirements pass through the ion selection chambers to contact corresponding detection surfaces of an ion detector array. The mass filter array may also be constructed so that at least one pair of ion selection chambers share at least one common field generating electrode.

DETAILED DESCRIPTION

Figure 1:
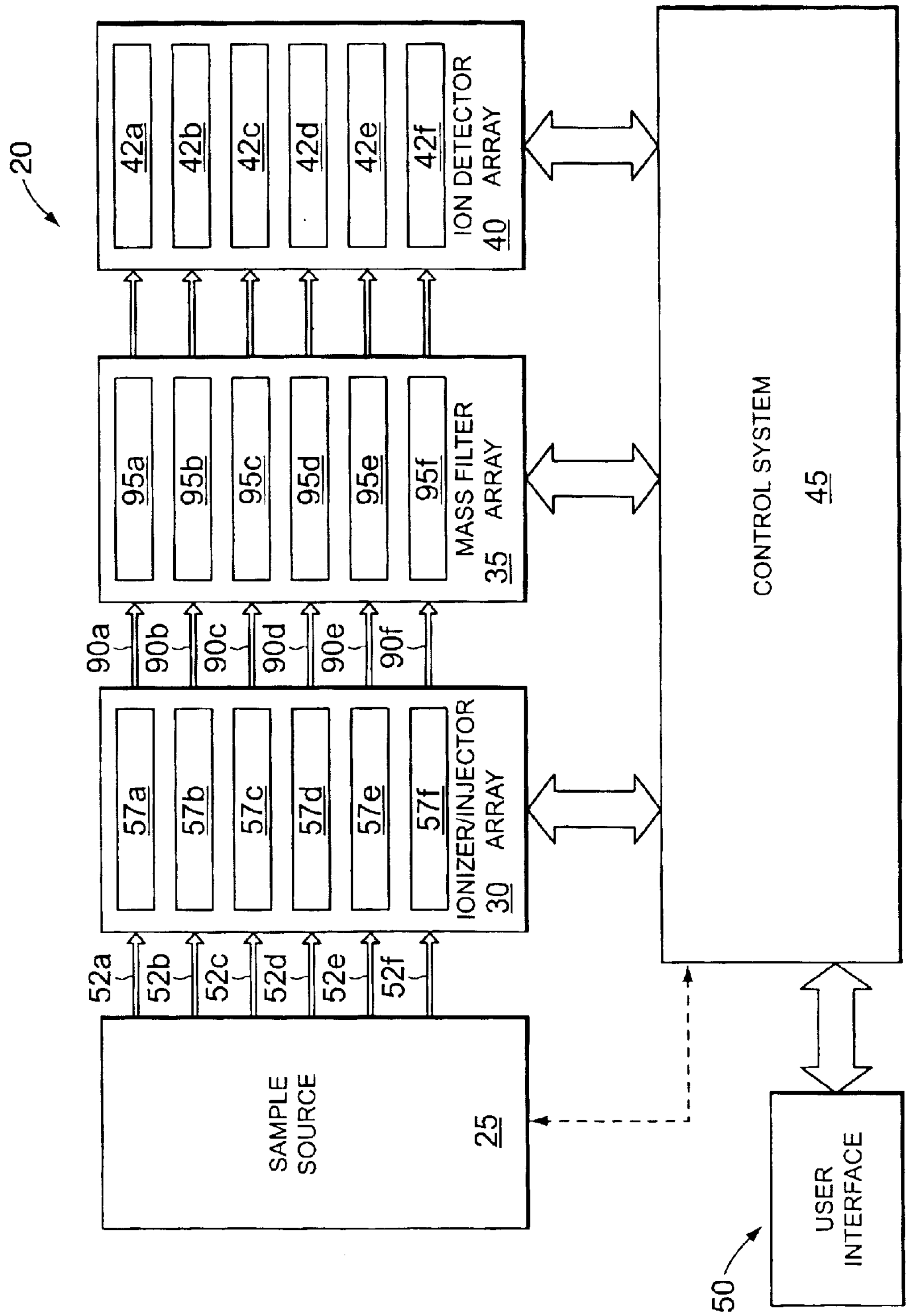
FIG. 1 is a schematic block diagram of one embodiment of a mass analysis system constructed in accordance with the teachings of the present invention.

The basic components of a mass analyzer constructed in accordance with one embodiment of the invention are shown in FIG. 1 in block diagram form. As illustrated, the analyzer 20 includes a sample source unit 25, an ionizer/ion injector array 30, a mass filter array 35, and an ion detector array 40. The components of the mass analyzer 20 may be automated by one or more programmable control systems 45. For example, control system 45 may be used to execute one or more of the following automation tasks: a) control of the ionization and ion injection parameters of one or more of the components of the ionizer/ion injector array 30 (i.e., ion beam focusing, ion beam entrance angle into individual chambers of the mass filter array 35, ion injection timing, ionization energy, ion exit velocity, etc.); b) control of the electric field parameters within individual ion selection chambers of the mass filter array 35 to select only ions of a desired m/Q range for detection; c) control of the position of the ion detection portions of the ion detector array 40 with respect to the ion outlets of the individual ion selection chambers of the mass filter array 35 to facilitate detection of ions exiting the chambers at a predetermined exit angle, $\theta_e$, to the general exclusion of ions having other exit angles; d) analysis of the data received from the mass analyzer 20 for presentation to a user or for subsequent data processing.

The parameters used to execute one or more of the foregoing automation tasks may be entered into the control system 45 by a human operator through, for example, user interface 50. Additionally, user interface 50 may be used to display information to the human operator for system monitoring purposes or the like. As such, user interface 50 may include a keyboard, display, switches, lamps, touch display, or any combination of these items.

With reference to FIG. 1, the material that is to be analyzed is provided to analyzer 20 through the sample source unit 25. Sample source unit 25 may include a single sample outlet or multiple sample outlets 52 (multiple outlets are shown in the illustrated embodiment). Further, the sample source unit 25 can be configured to provide a single material type at all of the sample outlets 52, different material types at the different sample outlets 52 or a combination of the foregoing in which a first group of sample outlets are configured to provide a first sample material while a second group of sample outlets are configured to provide a second sample material.

The sample material at each of the sample outlets 52 is provided to the input of a respective ionizer/ion injector 57 of the ionizer/ion injector array 30. Sample source unit 25 can introduce the sample material (which includes the analyte) at the sample outlets 52 in several ways, the most common being with a direct insertion probe, or by infusion through a capillary column. The individual ionizers/injectors 57 of the ionizer/ion injector array 30 may therefore be adapted to interface directly with whatever form the sample takes at the respective output 52. For example, the individual ionizers/injectors 57 can be adapted to interface directly with the output of gas chromatography equipment, liquid chromatography equipment, and/or capillary electrophoresis equipment. It will be recognized that any treatment of a sample material prior to the point at which sample source unit 25 provides it to the respective ionizer/ion injector 57 of array 30 is dependent on the particular analysis requirements.

The ionizer/ion injector array 30 may include a single inlet for receiving a single sample type from the sample source unit 25 or, as shown in the illustrated embodiment, multiple inlets respectively associated with each of the sample outlets 52. Upon receiving the samples from outlets 52, the ionizer/ion injectors 57 operate to ionize the molecules of the analyte included in the received samples and direct the ionized analyte molecules as a plurality of focused beams into respective ion selection chambers 95 of the mass filter array 35.

The ionization and injection can be accomplished using any of a number of techniques. For example, one method that allows for the ionization and transfer of the sample material from a condensed phase to the gas phase is known as Matrix-Assisted Laser Desorption/Ionization (MALDI). Another technique is known as Fast Atom/Ion Bombardment (FAB), which uses a high-energy beam of Xe atoms, $Cs^+$ions, or massive glycerol-$NH_4$ clusters to sputter the sample and matrix received from the sample source unit 25. The matrix is typically a non-volatile solvent in which the sample is dissolved. Although the ionization and ion injection processes of the illustrated embodiment are shown to occur in a single unit, it will be recognized that these processes can be executed in two or more separate units.

Figure 2:
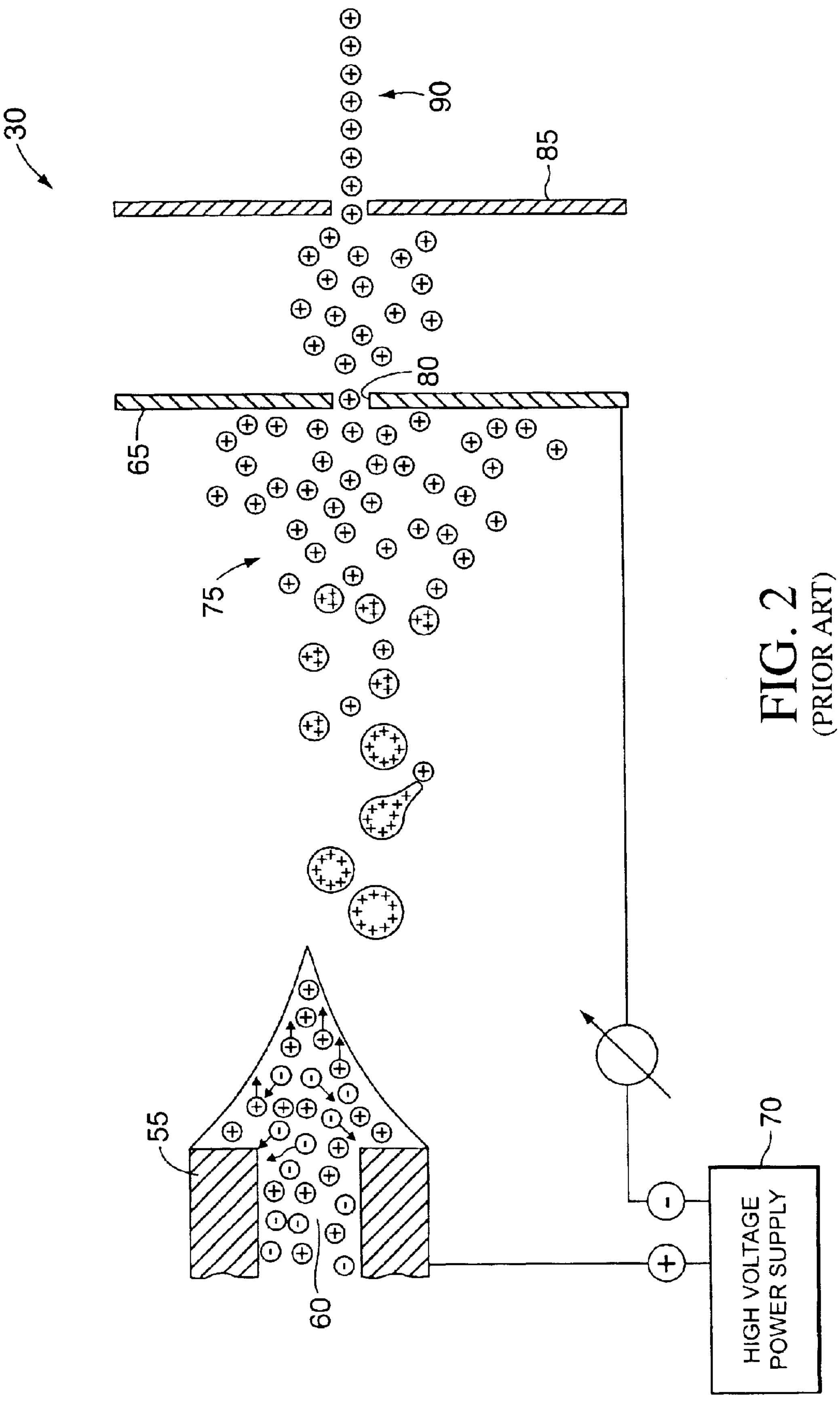
FIG. 2 (PRIOR ART)
FIG. 2 is an illustration of one embodiment of an electrospray ionizer suitable for use in the mass analysis system shown in FIG. 1.

A still further technique that may be implemented by the ionizer/ion injector array 30 to introduce the analyte into the mass filter array 35 is electrospray ionization. One embodiment of a basic electrospray ionizer/ion injector unit 57 is shown in FIG. 2. As illustrated. the ionizer/ion injector unit 57 is comprised of a capillary tube having an electrically conductive capillary tip 55 through which a sample liquid 60 is provided for ionization and injection into the respective ion selection chamber 95 of the mass filter array 35. The sample liquid 60 typically comprises a solvent containing an amount of the sample analyte. A counter-electrode 65 is disposed opposite the capillary tip 55 and an electric field is set-up between them by a power supply 70.

In operation, the electrically conductive capillary tip 55 oxidizes the solvent and sample analyte resulting in a meniscus of liquid that is pulled toward the counter-electrode 65. Small droplets of the liquid emerge from the tip of the meniscus and travel toward the counter-electrode 65. As the droplets make their way to the counter-electrode 65 under the influence of the electric field, the solvent tends to evaporate thereby leaving only charged gaseous ions 75 comprised of ionized analyte behind. A number of these charged gaseous ions 75 are accelerated through an orifice 80 in the counter-electrode 65 where a focusing lens 85 aligns them into a narrow ion beam 90. The narrow ion beam 90 is provided to the inlet of the respective ion selection chamber 95 of mass filter array 35 for separation of the ions based on their m/Q values.

Mass filter unit 35 operates as an ion filter based on the principles that govern the motion of charged particles in an electric field. The charged particles in the present case are ionized molecules with one or more net charges that are received from the ionizer/ion injectors 57. The ion charges may be positive or negative. Ions entering the device are filtered according to their m/Q values. An ion of a particular m/Q will be detectable when the appropriate adjustable instrument parameters are set to allow passage of the ion through the respective ion selection chamber 95 for impact with one or more ion detection portions of the ion detector array 40.

Figure 3:
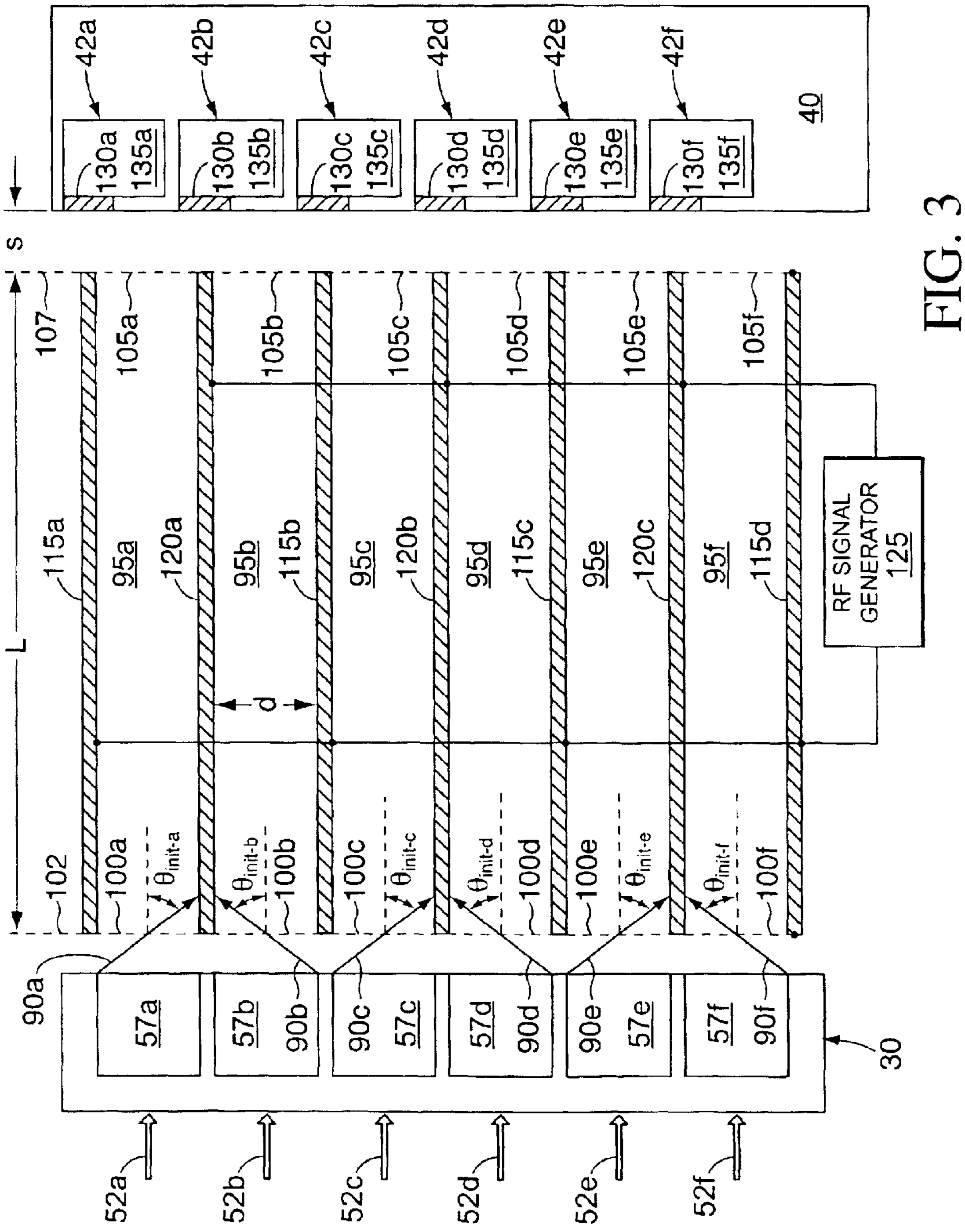
FIG. 3 is a side plan in view of selected portions of one embodiment of the mass analyzer of FIG. 1.

A mass filter array 35 constructed in accordance with one aspect of the present invention is shown in FIG. 3. For illustration purposes, the orthogonal x, y, z coordinate system of FIG. 4 in which the electrodes of a single ion selection chamber are shown, will be utilized as a reference frame.

Referring again to FIG. 3, the mass filter unit 35 includes a plurality of ion selection chambers, shown generally at 95, that are arranged vertically. It will be recognized, in view of the teachings herein, that the ion selection chambers 95 may be alternatively arranged in a horizontal array or in the form of a matrix having multiple columns and rows. Such configurations are discussed below.

Each of the ion selection chambers includes an ion inlet 100 lying in a first plane 102 and an ion outlet 105 lying in a second plane 107. More particularly, each ion inlet 100 and corresponding ion outlet 105 lie in the x-y coordinate plane at different positions along the z-axis (See FIG. 4 for coordinate references). The ion inlets 100 of the illustrated embodiment all lie generally in the same plane 102 while the ion outlets 105 all lie generally in the same plane 107. However, in some circumstances, it may be desirable to construct the mass filter array 35 so that it employs a plurality of ion selection chambers having different lengths, in which case two or more of the ion inlets 100 and/or ion outlets 105 of different ion selection chambers will not be coplanar.

Each of the ion selection chambers 95 is comprised of a plurality of electrodes that are disposed about a central axis extending in the z-direction of the respective chamber. As will be set forth in further detail below, the plurality of electrodes in a given ion selection chamber are used to generate a non-rotating, oscillating electric field in that chamber. This non-rotating, oscillating electric field selectively allows only ions of a given m/Q range to pass through the chamber.

Figure 4:
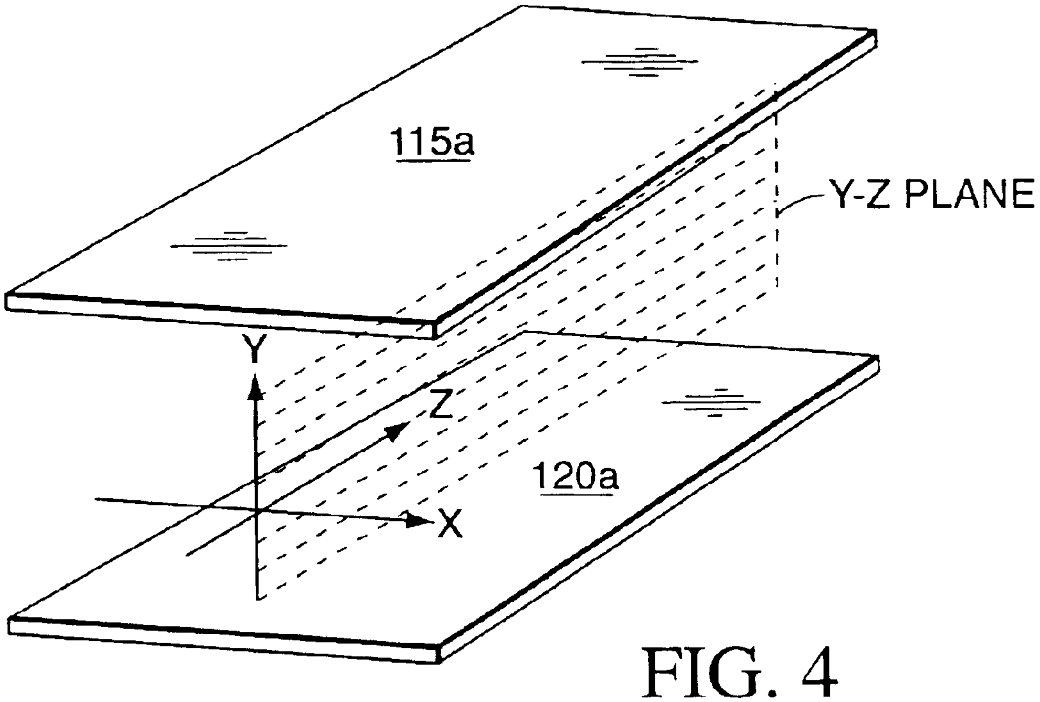
FIG. 4 is a perspective view of an orthogonal coordinate system that may be used to describe the arrangement of the components of the embodiment shown in FIG. 3 and their corresponding operation.

In the illustrated embodiment, only two opposed conductive parallel plate electrodes 115 and 120 are employed in each ion selection chamber 95. The planar surface of each electrode 115 is disposed opposite to and facing a planar surface of the other corresponding electrode 120 in the respective chamber 95. The electrodes 115 and 120 of a given ion selection chamber are spaced from one another by a distance d, for example, along the y-axis (FIG. 4). Although the magnitude of distance d may vary between different ion selection chambers 95, it is often preferable to keep this distance constant from chamber-to-chamber.

One manner in which the construction of mass filter array 35 can be optimized is through the sharing of electrodes by adjacent ion selection chambers 95. To this end, ion selection chamber 95*a* generates its electric field using upper electrode 115*a* and lower electrode 120*a*. In turn, ion selection chamber 95*b* generates its electric field using electrode 120*a* as its upper electrode and electrode 115*b* as its lower electrode. Ion selection chambers 95*a* and 95*b* therefore share electrode 120*a* resulting in a mass filter construction in which the number of electrodes required for electric field generation is reduced.

The electrodes of the mass filter array 35 are connected to opposite poles of a power source, such as an RF signal generator 125. RF signal generator 125 provides a time-dependent voltage to create a generally symmetrical varying electric field in the gap region between the electrodes of each ion selection chamber 95. When adjacent ion selection chambers are configured to share at least one electrode in the manner shown in FIG. 3, then the first pole of the RF signal generator 125 is connected to every other electrode of the array while the second pole is connected to the remaining electrodes. Consequently, adjacent ion selection chambers, such as chambers 95*a* and 95*b*, have electric fields of substantially the same magnitude that are approximately 180° out of phase with one another.

The ionizer/ion injectors 57 may provide their respective ion beams 90 at predetermined angles, $\theta_{init}$, with respect to the planes 102 of the ion inlets 100. In such instances, each ion beam 90 is effectively directed toward the planar face of one of the electrodes of the respective ion selection chamber to thereby generate ion motion components that principally lie in the y-z plane (See FIG. 4). Substantial values for entrance angles, $\theta_{init}$, are preferable to ensure that the mass analyzer 20 has a high m/Q resolution. For example, entrance angle, $\theta_{init}$, may have a value of at least 40° and, more preferably, a value of at least 60°.

As illustrated in FIG. 3, the entrance angles of the ion beams associated with adjacent ion selection chambers that share at least one electrode may have the same magnitude (i.e., a value of at least 60°) but have opposite signs. For example, the entrance angle, $\theta_{init\text{-}a}$, of the ion beam 90*a* associated with ion selection chamber 95*a* may be 65° while the entrance angle, $\theta_{init\text{-}b}$, of the ion beam 90*b* associated with ion selection chamber 95*b* may be −65°. If desired, the ion beams associated with adjacent (as well as non-adjacent) ion selection chambers may have different entrance angles to accommodate various analysis situations.

Operation of the-mass filter array 35 can best be simplified by examining the equations associated with the mass selection processes of a single ion selection chamber. Here, the operation of ion selection chamber 95*b* will be used as the example. To this end, the magnitude of the electric field, E, between the electrodes 120*a* and 115*b* with equal and opposite charge can be expressed as:

$$E=V/d \qquad \text{(Equation 1)}$$

where V is the amplitude of the voltage applied by RF signal generator 125 and d is the distance between the electrodes 120*a* and 115*b* along the y-axis. For a time-varying voltage source, such as that supplied by RF signal generator 125, the electric field acting on an ion within the field at any given time, t, is given by the expression:

$$E=(V/d)\cos(\omega t-\alpha) \qquad \text{(Equation 2)}$$

where V is the amplitude of the RF voltage, ω is the angular frequency, which is equal to 2π times the RF frequency, and α is the phase of the RF voltage when the ion enters the field. The geometry of the electrodes 120*a* and 115*b* as well as their relative orientation gives rise to a non-rotating, oscillating electric field in ion selection chamber 95*b*. In the illustrated embodiment, the field principally oscillates in the y-z plane and, as such, ions entering the ion selection chamber 95*b* are only subjected to a single electric field that oscillates in a single coordinate plane.

Applying Equation 2 to the geometry of the mass filter array 35, the field along the y-axis as an ion moves in the direction of the z-axis is given by the expression:

$$E_y=-(V/d)\cos(\omega t-\alpha) \qquad \text{(Equation 3)}$$

The minus sign accounts for the fact that the voltage, V, has been arbitrarily assigned to the top electrode 115*b*. As such, electric field, $E_y$, will be in the negative y direction.

Ignoring fringing effects, the illustrated embodiment does not provide for an electric field along either the x or z axes. As such, only the $E_y$ field will affect the trajectory of the ions in chamber 95*b*. To find the position of a particular ion with respect to the y-axis, the following equations may be used:

$$F=ma \text{ or } a=F/m \qquad \text{(Equation 4)}$$

where F is the force acting on the ion, m is mass of the ion and a is the acceleration of the ion. More particularly, the force on an ion in an electric field can be expressed as:

$$F=QE \qquad \text{(Equation 5)}$$

where Q is the charge on the ion and E is the magnitude of the electrical field.

Applying the foregoing equations, the following expression for ion acceleration is derived:

$$a=d^2y/dt^2=-QE/m=-(QV/md)\cos(\omega t-\alpha) \qquad \text{(Equation 6)}$$

Integrating Equation 6 provides the expression for the velocity of the ion along the y-axis:

$$v_y=dy/dt=-(QV/dm\ \omega)\sin(\omega t-\alpha)+C_1 \qquad \text{(Equation 7)}$$

where $C_1$ is a constant arising from the integration.

Integrating the velocity equation set forth in Equation 7, in turn, gives the y position of the ion in the electric field of the ion selection chamber 95 at time, t, and is expressed as:

$$y=(QV/dm\omega^2)\cos(\omega t-a)+Ct+C \qquad \text{(Equation 8)}$$

where $C_2$ is another constant arising from the integration.

Setting t=0 provides a solution for $C_1$ and $C_2$. Solving for $C_1$, the velocity in the y direction at t=0 is expressed as:

$$v_{y0}=v_0\sin(\theta_{init})=-(QV/dm\omega)\sin(-\alpha)+C_1=(QV/dm\omega)\sin(\alpha)+C_1 \qquad \text{(Equation 9)}$$

As such, $$C_1=v_0\sin(\theta_{init-b})-(QV/dm\omega)\sin(\alpha) \qquad \text{(Equation 10)}$$

where $v_0$ is the initial velocity of the ion as it enters the ion selection chamber 95*b* after it has been accelerated by the respective ionizer/lion injector 57*b*. The term, $v_{y0}$, is the y component of that initial velocity.

Solving for $C_2$, the y position at time t=0 is expressed as:

$$y_0=0=(QV/dm\omega^2)\cos(-\alpha)+C_2=QV/dm\omega^2\cos(\alpha)+C_2 \qquad \text{(Equation 11)}$$

As such, $$C=-(QV/dm\omega^2)\cos(\alpha) \qquad \text{(Equation 12)}$$

Using the foregoing values to derive a single equation to express the y position of the ion as it travels along the direction of the z-axis between electrodes 120*a* and 115*b* results in the following:

$$y=(QV/dm\omega^2)\cos(\omega t-\alpha)+[v_0\sin(\theta_{init})-(QV/dm\omega)\sin(\alpha)]t-(QV/dm\omega^2)\cos(\alpha) \qquad \text{(Equation 13)}$$

The position of a particular ion at time, t, along the z-axis is found by using the z component, $v_{z0}$ of the ion's initial velocity, $v_0$, and employing the time-distance equation. Velocity in the z direction at time, t=0, is expressed as:

$$v_{z0}=v_0\cos(\theta_{init-b}) \qquad \text{(Equation 14)}$$

and, according to the time-distance equation, $$z=v_{z0}t, \qquad \text{(Equation 15)}$$

therefore, $$z=v_0t\cos(\theta_{init-b}) \qquad \text{(Equation 16)}$$

where z is the distance traveled by the ion in the z direction in time, t. ignoring fringing effects, the z component of the velocity is generally unaffected by forces in the y direction. Therefore, the electric field generated between electrodes 120*a* and 115*b* generally has no effect on the time it takes an ion to travel through the ion selection chamber 95*b*. Further, since the motion of the ions is substantially confined to the y-z plane, knowing the values of y and z allows the plotting of the position of an ion at any time as it travels through the ion selection chamber 95*b*. As can be noted from Equation 16, larger values for entrance angle, $\theta_{init-b}$, result in longer travel times of an ion through the ion selection chamber 95*b* for a given initial velocity, $v_0$. As such, the ion is subjected to a larger number of RF cycles for a given frequency thereby increasing the resolution of the mass filter array 35.

Another separately unique aspect of the overall analyzer 20 is the relationship between the individual ion detectors 42 of the ion detector array 40 and the outlets 105 of the ion selection chambers 95. More particularly, each ion detector 42 is respectively associated with at least one of the ion selection chambers. Each ion detector 42 comprises an ion detection surface 130 that is arranged to principally detect ions that exit substantially at a predetermined exit angle, $\theta_e$, with respect to the plane of outlet 105 (here, the x-y plane) of the respective ion selection chamber and to the general exclusion of ions leaving the respective chamber at other exit angles. To this end, the ion detection surface 130 preferably has a surface area that is smaller than the area of the opening of the outlet 105 of the respective ion selection chamber. Further, the ion detection surface 130 may be displaced in the ±y directions and/or spaced a distance, S, from the respective ion outlet 105 in the z direction. Larger values for the distance, S, are preferable since such larger values provide greater m/Q resolution than do smaller values. However, the maximum value for the distance, S, will depend on the overall size constraints placed on the analyzer 20 in specific design situations.

Since the electric field used in the illustrated embodiment lies principally in the y-z coordinate plane, the position of a given ion detection surface 130 along the x-axis is substantially the same as the x-position of the incoming ion beam 90*b*. However, the ion detection surface 130*b* may be displaced along the x-axis when other electric field shapes are employed to thereby take advantage of alternative exit angle orientations.

Although the position of a given ion detection surface 130 may be fixed with respect to the respective ion outlet 105, the illustrated embodiment allows the position of one or more of the ion detection surfaces 130 to be varied. To this end, each ion detector 42 includes one or more automated actuators 135 that are connected to the ion detection surface 130 to move the ion detection surface 130 along one or more of the x, y or z axes. This allows fine tuning of the ion detection sensitivity and m/Q resolution of the analyzer 20. Further, individual adjustments to the positions of the individual ion detection surfaces 130 allows the analyzer 20 to implement a wide range of analysis processes having different testing criterion. As noted above, the actuator(s) 135 may be driven to place the respective ion detection surface 135 at the desired position by control system 45. The specific position parameters used by the control system 45 may be input as express position coordinate values through the user interface 50 or, alternatively, may be derived indirectly from other analysis parameters through system programming.

The proper position of a given ion detection surface 130 under a known set of test requirements may be derived through empirical data or through direct calculation of the exit angle, $\theta_e$. The exit angle, $\theta_e$, may be found by knowing the initial velocity of the ion as it enters the respective ion selection chamber, $v_0$, the time that the ion passes through outlet plane 107 to exit the respective ion outlet 105, and the z and y components ($v_z$ and $v_y$) of the velocity of the ion at the time of exit. The time the ion spends in the field is found by solving the expression:

$$t_e = L/[v_0 \cos(\theta_{init})] \quad \text{(Equation 17)}$$

where $t_e$ is the time the ion spends in the ion selection chamber 95, L is the length of the ion selection chamber 95 and $v_0$ is the initial velocity of the ion at the respective ion inlet 100. The denominator of the expression represents the z component, $v_{z0}$, of the initial velocity, $v_0$. The z component of the velocity, $v_{z0}$, is constant in the illustrated embodiment since there are no substantial forces acting on the ion in the z direction during its transit through the ion selection chamber 95. However, the y component of the velocity, $v_y$, will vary and depend on the strength of the electric field in the ion selection chamber 95 at any given time and position. At time $t_e$, this may be expressed as:

$$v_{ye} = v_{y0} - [QV/dm\ \omega][\cos(\omega t_e \alpha) - \cos(\alpha)] \quad \text{(Equation 18)}$$

where $v_{ye}$ is the y component of the velocity as the ion exits ion selection chamber 95 and passes through the outlet plane 107 of ion outlet 105.

Equations 17 and 18 may be combined to derive the following formulas for the exit angle, $\theta_e$:

$$\tan(\theta_e) = v_{ye}/v_z \text{ or } \theta_e = \arctan v_{ye}/v_z \quad \text{(Equation 19)}$$

therefore, $$\theta_e = \arctan([v_0 \sin(\theta_{init}) - [QV/dm\omega][\cos(\omega t_e \alpha) - \cos(\alpha)]]/v_0 \cos(\theta_{init})) \quad \text{(Equation 20)}$$

This can be simplified by introducing the ions into a given ion selection chamber 95 when the phase of the electric field at the respective ion inlet 100 is at $\alpha=0$. In such instances, Equation 20 simplifies to the following expression:

$$\theta_e = \arctan([v_0 \sin(\theta_{init}) - [QV/dm\omega][\cos(\omega t_e) - 1]]/v_0 \cos(\theta_{init})) \quad \text{(Equation 21)}$$

Operation of a single ion selection chamber **95*b* of the analyzer 20 under a known set of analysis conditions (i.e., conditions in which the analysis parameters such as V, ω,α, L, d, S, etc., are constant) is illustrated in FIGS. 5 through 9. In each instance, ions entering the varying electric field of the ion selection chamber 95*b* are accelerated towards electrode 120*a*. At a given frequency, ω, ions entering the ion selection chamber 95*b* may experience one of the three conditions shown in FIGS. 5 through 9**. Which condition an ion experiences depends on its mass, charge and velocity.

Figure 5:
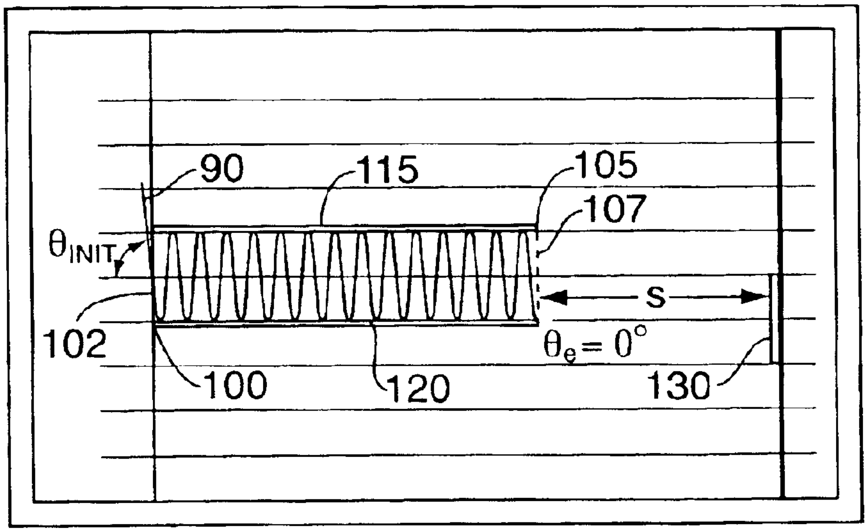
FIG. 5 illustrates the trajectory of an ion having the selected m/Q as it passes through the ion selection chamber and into contact with the ion detection surface.

With reference to FIG. 5, ions with the selected m/Q and velocity will have stable trajectories through the ion selection chamber **95*b*. Such selected ions ultimately pass through the outlet plane 107 of respective ion outlet 105*b* at the predetermined exit angle, $\theta_e$, to impinge on the corresponding ion detection surface 130*b*. The ion detection surface 130*b* has been placed precisely at a known position with respect to ion outlet 105*b* based on the predetermined exit angle, $\theta_e$, as well as on other system design criterion (i.e., resolution, sensitivity, etc.). In the illustrated embodiment, the predetermined exit angle, $\theta_e=0°$, and the ion detection surface 130*b* is spaced from the x-y plane of ion outlet 105*b* by a distance, S. Further, it can be seen that the ion detection surface 130*b* is displaced from central axis 110*b* in the negative y direction so that a portion of the detection surface is exposed in an area above electrode 115*b* while another portion of the detection surface is exposed in an area below electrode 115*b*. Given this particular configuration, an ion will travel along a stable trajectory and impact detection surface 130*b* whenever the acceleration provided by the electric field along the y-axis substantially cancels the y component of the initial velocity, $v_{y0}$. Under such conditions, the ion will be alternately accelerated towards and away from the electrodes 115*b* and 120*a* as the field changes magnitude and direction. The z component of the ion's velocity, $v_z$, will carry it toward the respective ion detector 40*b*. In the illustrated embodiment, selected ions will follow the trajectory outline shown in FIG. 5 in which the ions oscillate in the y-z plane while traveling linearly along a z-axis path that is substantially parallel to the electrodes 120*a* and 115*b***.

Figure 6:
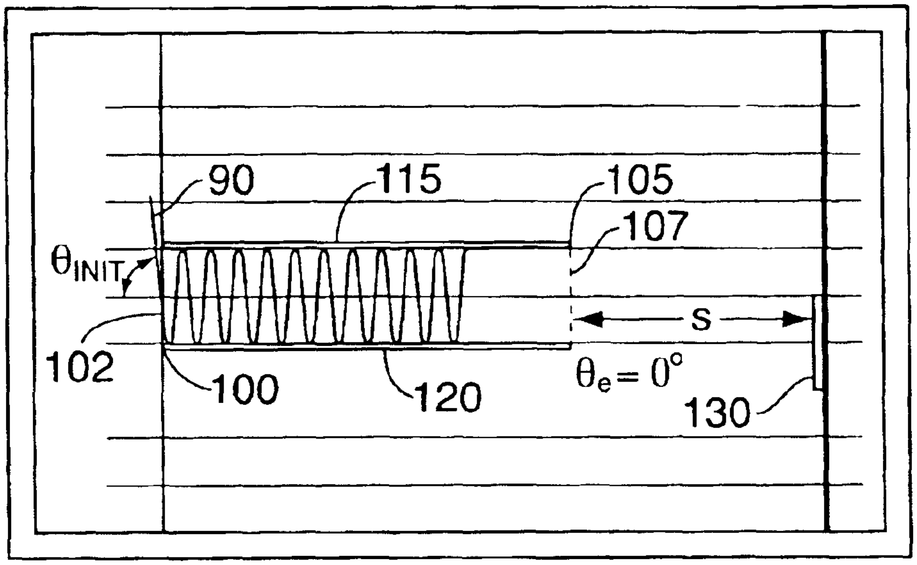
FIG. 6 illustrates the trajectory of an ion having an m/Q that is substantially above the selected m/Q.
Figure 7:
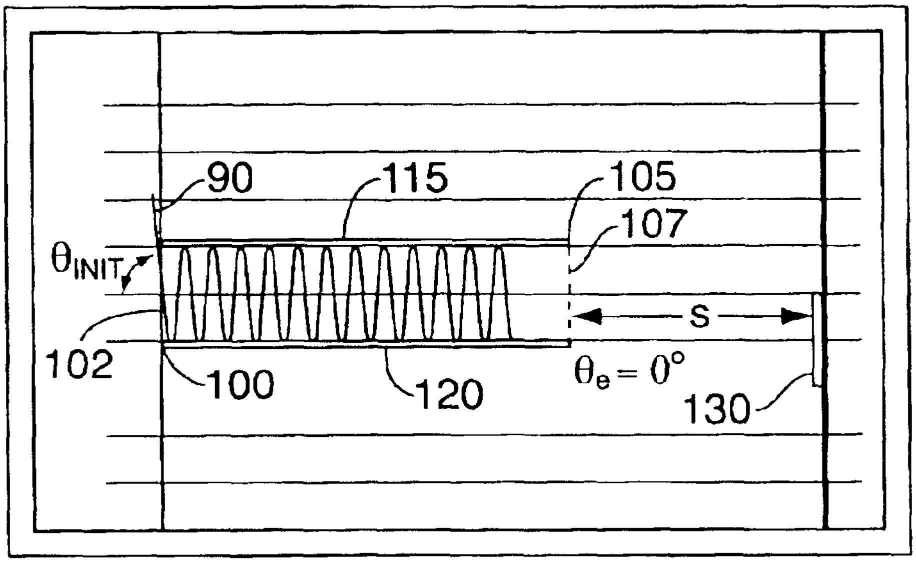
FIG. 7 illustrates the trajectory of an ion having an m/Q that is substantially below the selected m/Q.

FIG. 6 illustrates the trajectory of an ion having an m/Q that is substantially above the selected m/Q while FIG. 7 illustrates the trajectory of an ion having an m/Q that is substantially below the selected m/Q. In each instance, the ions have unstable trajectories and cannot pass through the ion selection chamber **95*b* before contacting one of the electrodes 120*a* and 115*b*. As shown, such ions have a trajectory outline that is significantly tilted with respect to the z-axis and toward electrodes 120*a* and 115*b***.

Figure 8:
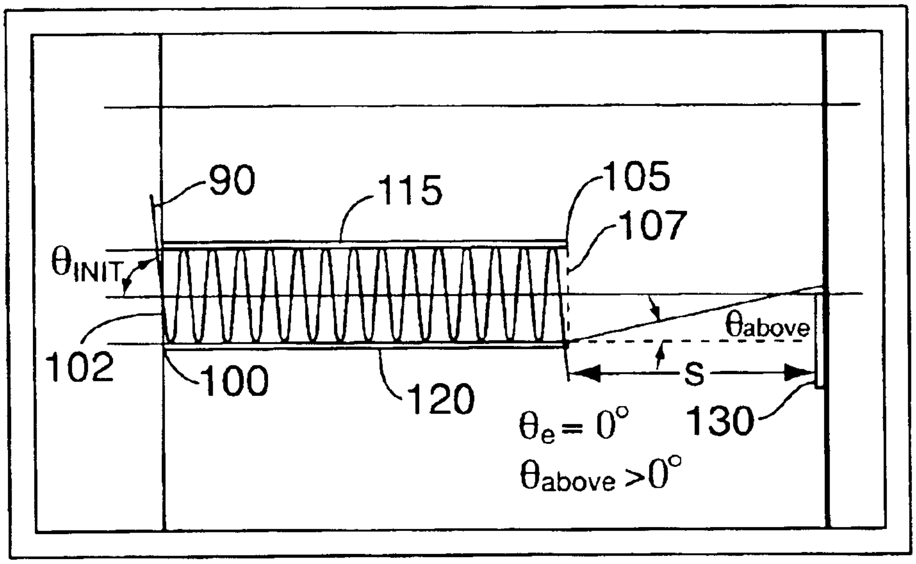
FIG. 8 illustrates the trajectory of an ion having an m/Q that is slightly above the selected m/Q.
Figure 9:
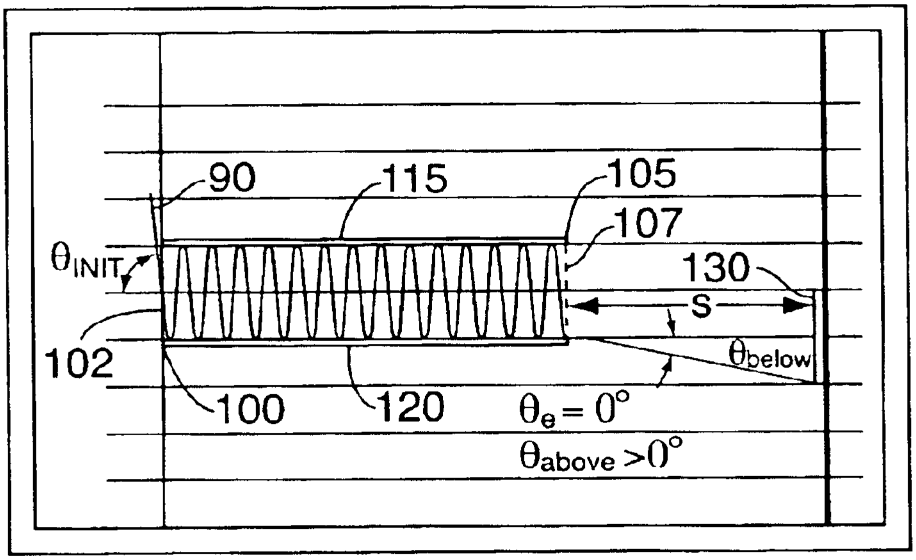
FIG. 9 illustrates the trajectory of an ion having an m/Q that is slightly below the selected m/Q.

FIG. 8 illustrates the trajectory of an ion that has an m/Q that is only slightly above the selected m/Q while FIG. 9 illustrates the trajectory of an ion having an m/Q that is only slightly below the selected m /Q. As illustrated, such ions may still pass through the ion selection chamber **95*b* but will miss the respective ion detection surface 130*b* because they each follow a slightly different trajectory than selected ions and pass through the outlet plane 107 of ion outlet 105*b* at angles, $\theta_{above}$ and $\theta_{below}$, respectively, that are different from the predetermined exit angle, $\theta_e$. The ion detection arrangement of the Illustrated embodiment takes advantage of this ion motion property to significantly increase the resolution of the analyzer 20. To this end, it will be recognized that the resolution of the analyzer 20 is indirectly proportional to the area of detection surface 130** and is directly proportional to the distance, S.

In practice, the RF voltage, V, for a given ion selection chamber is held constant and the mass spectrum for a sample is obtained by scanning through a set of predetermined frequencies, ω, with the RF signal generator 125. Generally stated, frequencies in the several hundreds of kilohertz range may be used with voltages in the several hundreds of volts range also being usable. Frequency scanning may be placed under the control of control system 45. At each frequency, ω, only ions within a selected m/Q range will follow the stable trajectory shown in FIG. 5. The parameters of analyzer 20 should be adjusted so those ions with stable trajectories approach the electrodes 115 and 120 as closely as possible as they travel to the respective ion detectors 42. Ions with m/Q values that are not selected at the prescribed frequency will then either crash into one of the electrodes 115 and 120 before completing their journey through the respective ion selection chamber 95 or, alternatively, they will miss the respective ion detection surface 130. One of the parameters that may be adjusted in this regard is the entrance angle, $\theta_{init}$. As noted above, larger entrance angles, $\theta_{init}$, are preferable to smaller entrance angles, with angles of at least 40° being desirable and angles of at least 60° or more providing even higher m/Q selectivity and resolution. Increasing the aspect ratio of the device will also result in higher resolution.

Figure 10:
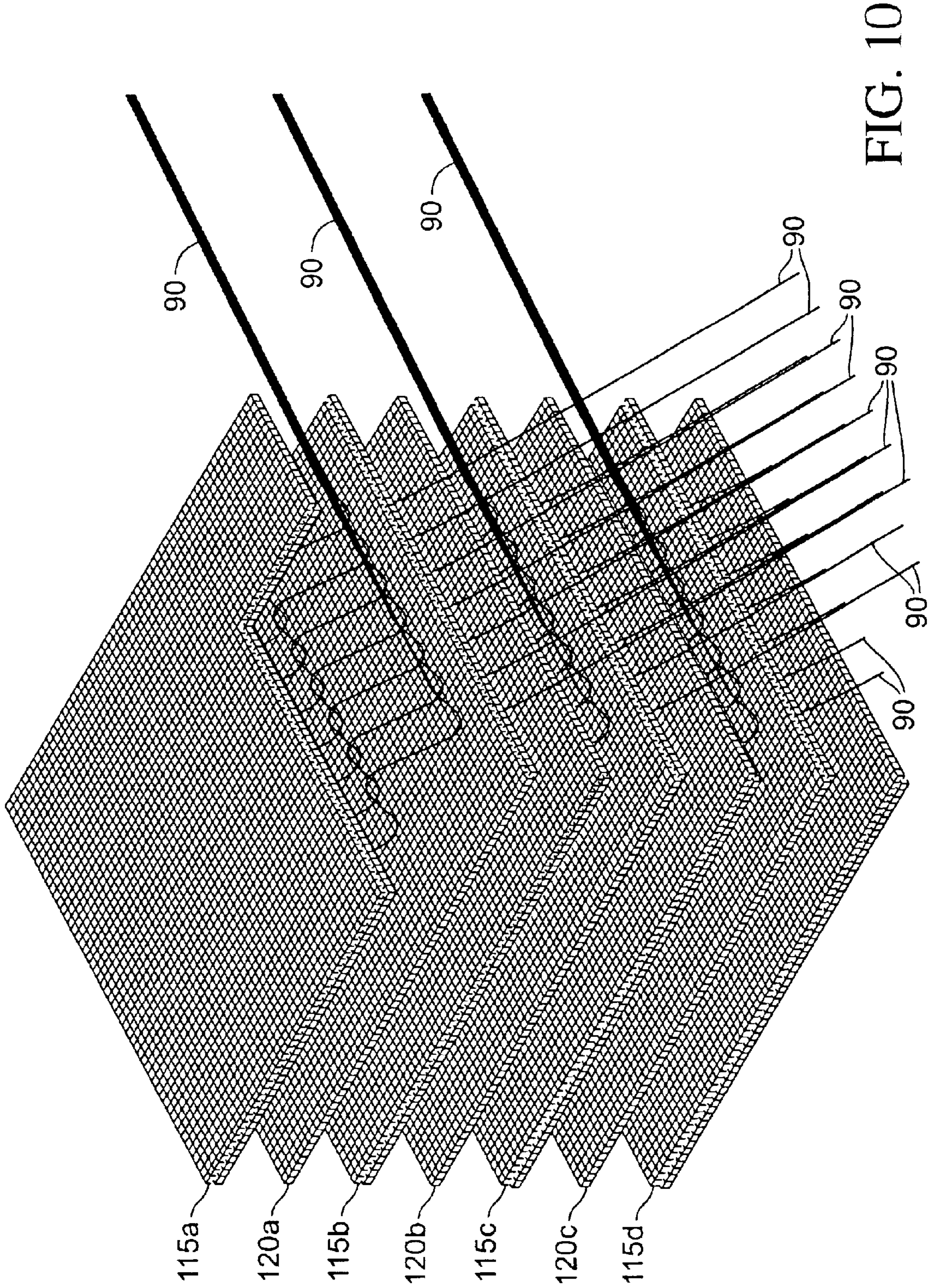
FIG. 10 is a perspective view of a vertical stack of ion selection chambers wherein a horizontal row of ion beams is directed into each chamber.

FIG. 10 is a perspective view of an embodiment of a mass filter array 35 constructed generally in the manner shown in FIG. 3 in which more than one ion beam is injected into each ion selection chamber 95. In this embodiment, a plurality of ionizers/ion injectors are associated with each ion selection chamber. The ionizers/ion injectors direct a row of generally parallel ion beams 90 into each respective ion selection chamber. Horizontally adjacent ion beams may be spaced from one another a sufficient distance to prevent substantial overlap of the beams in the x-z plane.

Figure 11:
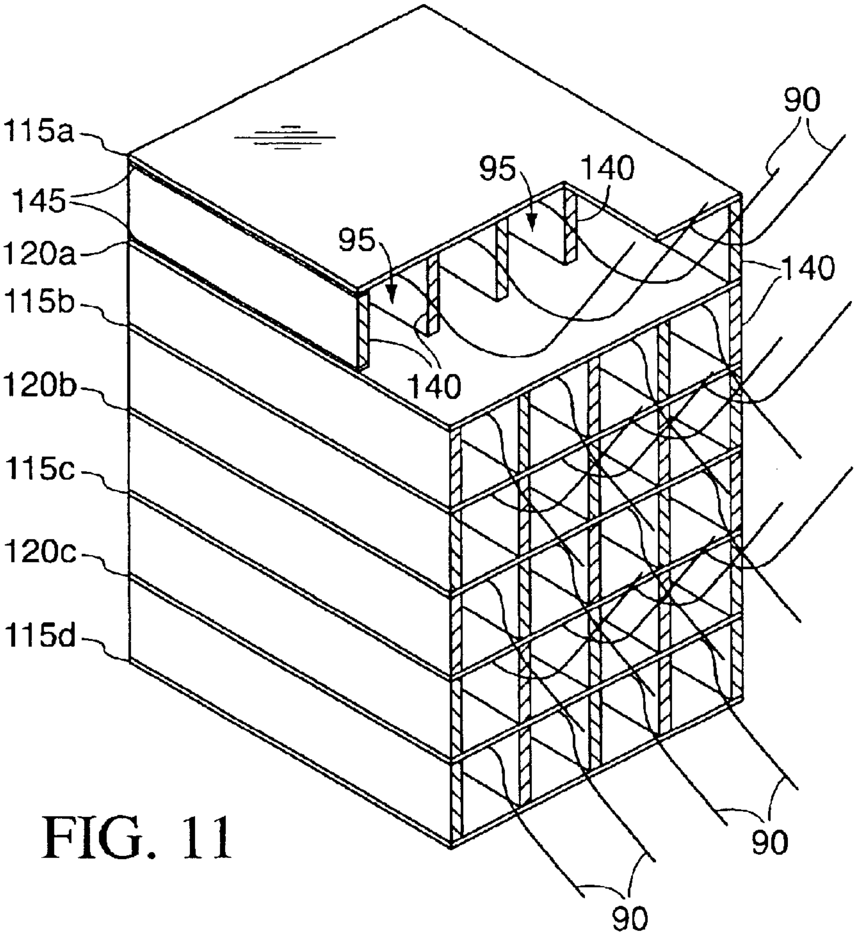
FIGS. 11 and 12 illustrate another arrangement of ion selection chambers wherein each ion selection chamber of a given horizontal row is separated from adjacent chambers by at least one separation member.
Figure 12:
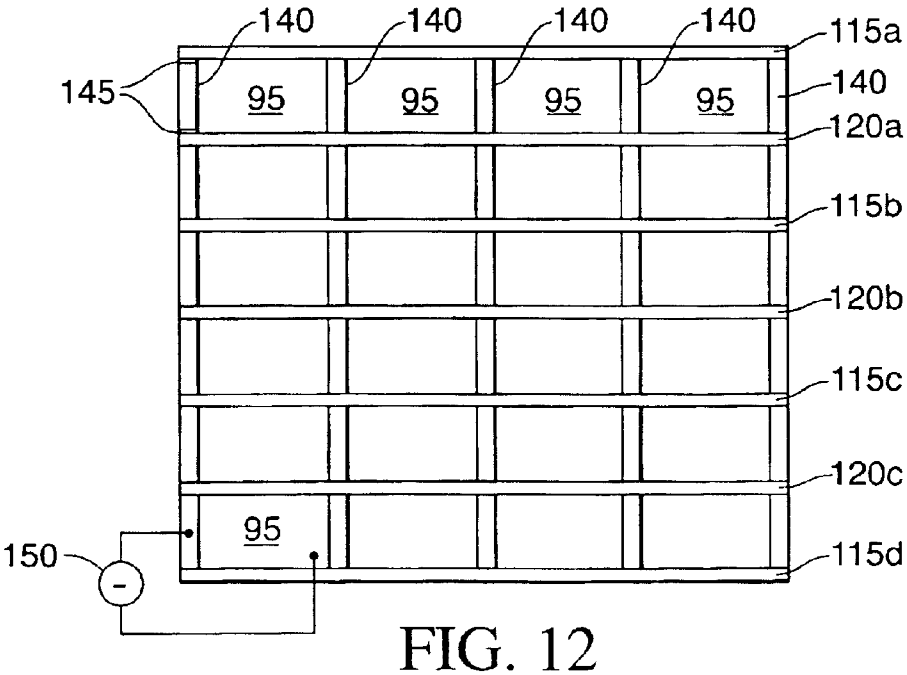

FIG. 11 is a perspective view of a modified version of the mass filter array 35 shown in FIG. 10 while FIG. 12 is an end the view thereof. In this embodiment, one or more vertical members 140 horizontally divide each ion selection chamber into a plurality of separate, horizontally adjacent ion selection chambers 95. The vertical members 140 may be formed from a dielectric material to electrically isolate the ion selection chambers of each horizontal row from one another. Further, the vertical members 140 may additionally function as a mechanical support system for the electrodes of the mass filter array 35.

In some instances, vertical members 140 may be formed from an electrically conductive material and yet to be electrically isolated from the electrodes of the mass filter array 35. Electrical isolation of the vertical members 140 from the electrodes 115 and 120 may be achieved by placing a dielectric material 145 at the junctions between the vertical members and electrodes (only two isolated junctions shown). In this type of construction, vertical members 140 may be connected to a DC voltage source 150 to generate a static electric field that can be used to focus or otherwise influence the motion of the respective ion beam 90 in the x-z plane (only one ion selection chamber 95 being shown here and FIG. 12 with a connection to the voltage source 150). Notably, such a static electric field does not result in a rotating electric field and the oscillating electric field components used to selectively pass ions of a given m/Q are still principally aligned in a single coordinate plane.

As can be derived from the foregoing description, the mass analyzer 20 has the capability of processing one or more analytes in a parallel manner. For example, the mass analyzer 20 may concurrently process a plurality of samples that pass through the analyzer at substantially the same time. Alternatively, parallel processing may proceed with a plurality of samples passing through the analyzer at substantially different times. In each instance, the mass analyzer directs at least two samples (of the same or different substance) through separate ion selection chambers of the mass filter array.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A mass filter array comprising:

a first ion selection chamber having an ion inlet lying in an inlet plane and an ion outlet lying in an outlet plane, the first ion selection chamber further having a first plurality of electrodes disposed between said ion inlet and said ion outlet;

a second ion selection chamber having an ion inlet lying in an inlet plane and an ion outlet lying in an outlet plane, the second ion selection chamber further having a second plurality of electrodes disposed between said ion inlet and said ion outlet, the first and second plurality of electrodes including at least one common electrode shared by both the first and second ion selection chambers;

an RF signal generator connected to said first and second plurality of electrodes to produce a non-rotating, oscillating electric field respectively in each of said first and second ion selection chambers.

2. A mass filter array as claimed in claim 1 wherein said non-rotating, oscillating electric field in said first ion selection chamber is substantially equal in magnitude to said non-rotating, oscillating electric field in said second ion selection chamber.

3. A mass filter array as claimed in claim 2 wherein said non-rotating, oscillating electric field in said first ion selection chamber is out of phase from said non-rotating, oscillating electric field in said second ion selection chamber by about 180°.

4. A mass filter array as claimed in claim 1 wherein said non-rotating, oscillating electric field in said first ion selection chamber is out of phase from said non-rotating, oscillating electric field in said second ion selection chamber by about 180°.

5. A mass filter array as claimed in claim 1 wherein said first plurality of electrodes comprises:

a first electrode having a planar surface; and a second electrode having a planar surface, the planar surface of said second electrode facing the planar surface of said first electrode and being generally parallel therewith.

6. A mass filter array as claimed in claim 1 wherein said first plurality of electrodes comprises:

a first electrode having a planar surface; and a second electrode having first and second opposed planar surfaces, said first planar surface of said second electrode facing the planar surface of said first electrode and being generally parallel therewith.

7. A mass filter array as claimed in claim 6 wherein said second plurality of electrodes comprises:

said second planar surface of said second electrode;

a third electrode having a planar surface, the planar surface of said third electrode facing said second planar surface of said second electrode and being generally parallel therewith.

8. A mass filter array as claimed in claim 7 wherein said RF signal generator includes first and second terminals of opposite polarity, said first and third electrodes being connected to said first terminal and said second electrode being connected to said second terminal.

9. A mass analyzer comprising:

a mass filter unit having a plurality of ion selection chambers disposed in parallel with one another, each of the plurality of ion selection chambers respectively having an ion inlet lying in an inlet plane and an ion outlet lying in an outlet plane;

a plurality of electrodes disposed in said plurality of ion selection chambers;

at least one RF signal generator connected to said plurality of electrodes to produce a non-rotating, oscillating electric field in each of said plurality of ion selection chambers;

a plurality of ion injectors respectively coupled to each of said ion inlets of said plurality of ion selection chambers to inject ions into each of said plurality of ion selection chambers.

10. A mass analyzer as claimed in claim 9 wherein the inlets of said plurality of ion selection chambers lie substantially in a single inlet plane.

11. A mass analyzer as claimed in claim 10 wherein the outlets of said plurality of ion selection chambers lie substantially in a single outlet plane.

12. A mass analyzer as claimed in claim 9 wherein the outlets of said plurality of ion selection chambers lie substantially in a single outlet plane.

13. A mass analyzer as claimed in claim 9 wherein adjacent ones of said plurality of ion selection chambers share at least one of said plurality of electrodes for generating the non-rotating, oscillating electric field in the respective ion selection chamber.

14. A mass analyzer as claimed in claim 9 wherein at least two of said plurality of ion selection chambers share at least one of said plurality of electrodes for generating the non-rotating, oscillating electric field in the respective ion selection chamber.

15. A mass analyzer as claimed in claim 14 wherein at least two of said plurality of ion selection chambers are disposed immediately adjacent one another.

16. A mass analyzer as claimed in claim 9 wherein at least two of said plurality of ion selection chambers share at least two of said plurality of electrodes for generating the non-rotating, oscillating electric field in the respective ion selection chamber.

17. A mass analyzer as claimed in claim 16 wherein at least two of said plurality of ion selection chambers are disposed immediately adjacent one another.

18. A mass analyzer as claimed in claim 9 wherein the non-rotating, oscillating electric fields in adjacent ones of said plurality of ion selection chambers are substantially equal in magnitude.

19. A mass analyzer as claimed in claim 18 wherein the non-rotating, oscillating electric fields in adjacent ones of said plurality of ion selection chambers are out of phase with one another by about 180°.

20. A mass analyzer as claimed in claim 9 wherein the non-rotating, oscillating electric fields in adjacent ones of said plurality of ion selection chambers are out of phase with one another by about 180°.

21. A mass filter array as claimed in claim 9 comprising:

a first electrode disposed in a first ion selection chamber of said plurality of ion selection chambers, said first electrode having a planar surface; and a second electrode disposed in said first ion selection chamber, said second electrode having first and second opposed planar surfaces, said first planar surface of said second electrode facing the planar surface of said first electrode and being generally parallel therewith.

22. A mass analyzer as claimed in claim 21 comprising:

a second ion selection chamber of said plurality of ion selection chambers disposed immediately adjacent said first ion selection chamber, said second planar surface of said second electrode being disposed in said second ion selection chamber;

a third electrode disposed in said second ion selection chamber, said third electrode having a planar surface facing said second planar surface of said second electrode and being generally parallel therewith.

23. A mass analyzer as claimed in claim 22 wherein said RF signal generator includes first and second terminals of opposite polarity, said first and third electrodes being connected to said first terminal and said second electrode being connected to said second terminal.

24. A mass analyzer as claimed in claim 9 wherein at least one of said plurality of ion injectors comprises an ionizer adapted to receive a sample substance from a liquid chromatography apparatus, said sample substance comprising at least one analyte for ionization.

25. A mass analyzer as claimed in claim 9 wherein at least one of said plurality of ion injectors comprises an ionizer adapted to receive a sample substance from an electrophoresis apparatus, said sample substance comprising at least one analyte for ionization.

26. A mass analyzer as claimed in claim 9 wherein at least one of said plurality of ion injectors comprises an electrospray device.

27. A mass analyzer as claimed in claim 9 wherein at least one of said plurality of ion injectors comprises an ionizer that is adapted to receive a sample material from a direct insertion probe, said sample material comprising an analyte for ionization.

28. A mass analyzer as claimed in claim 9 wherein at least one of said plurality of ion injectors comprises an ionizer that is adapted to receive a sample material from a capillary column, said sample material comprising an analyte for ionization.

29. A mass analyzer as claimed in claim 9 wherein at least one of said plurality of ion injectors comprises an ionizer that is adapted to generate ions of an analyte using a matrix-assisted laser desorption/ionization process.

30. A mass analyzer as claimed in claim 9 wherein at least one of said plurality of ion injectors comprises an ionizer that is adapted to generate ions of an analyte using an electrospray process.

31. A mass analyzer as claimed in claim 9 wherein said plurality of electrodes comprises:

a first electrode having a planar surface; and a second electrode having a planar surface, the planar surface of said second electrode facing the planar surface of said first electrode and being generally parallel therewith.

32. A mass analyzer as claimed in claim 9 wherein at least one of said plurality of ion injectors is coupled to a respective inlet of at least one of said plurality of ion selection chambers to inject ions at an angle of at least 60° with reference to the inlet plane of the respective ion selection chamber.

33. A mass analyzer as claimed in claim 9 wherein each of said plurality of ion injectors is coupled to a respective inlet of each of said plurality of ion selection chambers to inject ions at an angle of at least 60° with reference to the inlet plane of the respective ion selection chamber.

34. A mass analyzer as claimed in claim 9 wherein at least one of said plurality of ion injectors is coupled to a respective inlet of at least one of said plurality of ion selection chambers to inject ions at an angle of at least 40° with reference to the inlet plane of the respective ion selection chamber.

35. A mass analyzer as claimed in claim 9 wherein each of said plurality of ion injectors is coupled to a respective inlet of each of said plurality of ion selection chambers to inject ions at an angle of at least 40° with reference to the inlet plane of the respective ion selection chamber.

36. A mass analyzer as claimed in claim 9 and further comprising a plurality of ion detection surfaces proximate respective ion outlets of each of said plurality of ion selection chambers, each of said plurality of ion detection surfaces being positioned to primarily detect ions exiting substantially at a predetermined exit angle with reference to the outlet plane of the respective ion selection chamber to the general exclusion of ions having other exit angles.

* * * * *